(12) United States Patent
Kim et al.

(10) Patent No.: US 8,664,101 B2
(45) Date of Patent: Mar. 4, 2014

(54) MULTIPLE MOLD STRUCTURE METHODS OF MANUFACTURING VERTICAL MEMORY DEVICES

(75) Inventors: Hyo-Jung Kim, Seoul (KR); Dae-Hong Eom, Hwaseong-si (KR); Jong-Heun Lim, Seoul (KR); Myung-Jung Pyo, Hwaseong-si (KR); Byoung-Moon Yoon, Suwon-si (KR); Kyung-Hyun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 10 days.

(21) Appl. No.: 13/596,621

(22) Filed: Aug. 28, 2012

(65) Prior Publication Data

US 2013/0065386 A1    Mar. 14, 2013

(30) Foreign Application Priority Data

Sep. 8, 2011    (KR) .................. 10-2011-0091289

(51) Int. Cl.
*H01L 21/3205*    (2006.01)
*H01L 21/4763*    (2006.01)

(52) U.S. Cl.
USPC ................................ 438/591; 257/E21.409

(58) Field of Classification Search
USPC .................... 438/591; 257/E21.409
See application file for complete search history.

(56) References Cited

U.S. PATENT DOCUMENTS

| | | | |
|---|---|---|---|
| 6,969,658 B2 | 11/2005 | Cho et al. | |
| 7,927,926 B2 * | 4/2011 | Katsumata et al. | 438/129 |
| 8,048,798 B2 * | 11/2011 | Kidoh et al. | 438/639 |
| 8,394,716 B2 * | 3/2013 | Hwang et al. | 438/667 |
| 2003/0199155 A9 | 10/2003 | Cho et al. | |
| 2007/0252201 A1 * | 11/2007 | Kito et al. | 257/331 |
| 2008/0067583 A1 * | 3/2008 | Kidoh et al. | 257/326 |
| 2009/0146206 A1 * | 6/2009 | Fukuzumi et al. | 257/324 |
| 2009/0224309 A1 * | 9/2009 | Kidoh et al. | 257/326 |
| 2009/0230449 A1 * | 9/2009 | Sakaguchi et al. | 257/298 |
| 2009/0230462 A1 * | 9/2009 | Tanaka et al. | 257/326 |
| 2010/0090286 A1 * | 4/2010 | Lee et al. | 257/368 |
| 2010/0096682 A1 * | 4/2010 | Fukuzumi et al. | 257/314 |
| 2010/0133599 A1 * | 6/2010 | Chae et al. | 257/315 |
| 2010/0155818 A1 * | 6/2010 | Cho et al. | 257/324 |

(Continued)

FOREIGN PATENT DOCUMENTS

| | | |
|---|---|---|
| JP | 11-177058 A | 7/1999 |
| KR | 2003-0001086 A | 1/2003 |
| KR | 2003-0001827 A | 1/2003 |
| KR | 10-0404224 B1 | 10/2003 |

*Primary Examiner* — Yu-Hsi D Sun
*Assistant Examiner* — Grant Withers
(74) *Attorney, Agent, or Firm* — Myers Bigel Sibley & Sajovec, P.A.

(57) ABSTRACT

A first insulating interlayer is formed on a substrate including first and second regions. The first insulating interlayer has top surface, a height of which is greater in the first region than in the second region. A first planarization stop layer and a second insulating interlayer are formed. The second insulating interlayer is planarized until the first planarization stop layer is exposed. The first planarization stop layer and the first and second insulating interlayers in the second region are removed to expose the substrate. A lower mold structure including first insulation layer patterns, first sacrificial layer patterns and a second planarization stop layer pattern is formed. The first insulation layer patterns and the first sacrificial layer patterns are alternately and repeatedly formed on the substrate, and a second planarization stop layer pattern is formed on the first insulation layer pattern.

20 Claims, 15 Drawing Sheets

(56) References Cited

U.S. PATENT DOCUMENTS

| | | | |
|---|---|---|---|
| 2010/0163968 A1* | 7/2010 | Kim et al. | 257/324 |
| 2010/0200908 A1* | 8/2010 | Lee et al. | 257/326 |
| 2010/0207193 A1* | 8/2010 | Tanaka et al. | 257/324 |
| 2010/0207195 A1* | 8/2010 | Fukuzumi et al. | 257/326 |
| 2010/0254191 A1* | 10/2010 | Son et al. | 365/185.05 |
| 2010/0327339 A1* | 12/2010 | Tanaka et al. | 257/324 |
| 2011/0001178 A1* | 1/2011 | Iwase et al. | 257/315 |
| 2011/0018050 A1* | 1/2011 | Fujiwara et al. | 257/324 |
| 2011/0031547 A1* | 2/2011 | Watanabe | 257/319 |
| 2011/0049646 A1* | 3/2011 | Lim et al. | 257/410 |
| 2011/0104869 A1* | 5/2011 | Hyun et al. | 438/430 |
| 2011/0115010 A1* | 5/2011 | Shim et al. | 257/314 |
| 2011/0180866 A1* | 7/2011 | Matsuda et al. | 257/324 |
| 2011/0180941 A1* | 7/2011 | Hwang et al. | 257/786 |
| 2011/0284947 A1* | 11/2011 | Kito et al. | 257/324 |
| 2011/0287623 A1* | 11/2011 | Oh et al. | 438/591 |
| 2011/0309431 A1* | 12/2011 | Kidoh et al. | 257/324 |
| 2011/0309432 A1* | 12/2011 | Ishihara et al. | 257/324 |
| 2012/0008400 A1* | 1/2012 | Fukuzumi et al. | 365/185.18 |
| 2012/0028450 A1* | 2/2012 | Son et al. | 438/479 |
| 2012/0052672 A1* | 3/2012 | Nakanishi et al. | 438/591 |
| 2012/0052673 A1* | 3/2012 | Yoo et al. | 438/591 |
| 2012/0061744 A1* | 3/2012 | Hwang et al. | 257/324 |
| 2012/0077320 A1* | 3/2012 | Shim et al. | 438/269 |
| 2012/0083111 A1* | 4/2012 | Lim et al. | 438/591 |
| 2012/0098050 A1* | 4/2012 | Shim et al. | 257/324 |
| 2012/0119287 A1* | 5/2012 | Park et al. | 257/329 |
| 2012/0149185 A1* | 6/2012 | Kim et al. | 438/589 |
| 2012/0187471 A1* | 7/2012 | Yu et al. | 257/324 |
| 2012/0193705 A1* | 8/2012 | Lim et al. | 257/330 |
| 2012/0208347 A1* | 8/2012 | Hwang et al. | 438/430 |
| 2012/0211816 A1* | 8/2012 | Yahashi | 257/314 |
| 2012/0228712 A1* | 9/2012 | Jeong et al. | 257/368 |
| 2012/0256253 A1* | 10/2012 | Hwang et al. | 257/329 |
| 2012/0267702 A1* | 10/2012 | Jee et al. | 257/324 |
| 2013/0017629 A1* | 1/2013 | Pyo et al. | 438/16 |
| 2013/0126961 A1* | 5/2013 | Fukuzumi et al. | 257/324 |
| 2013/0148398 A1* | 6/2013 | Baek et al. | 365/51 |
| 2013/0168752 A1* | 7/2013 | Kim et al. | 257/314 |
| 2013/0171788 A1* | 7/2013 | Yang et al. | 438/268 |
| 2013/0171809 A1* | 7/2013 | Lee et al. | 438/492 |
| 2013/0214344 A1* | 8/2013 | Lim et al. | 257/324 |
| 2013/0237047 A1* | 9/2013 | Nakao et al. | 438/591 |
| 2013/0277731 A1* | 10/2013 | Goda et al. | 257/324 |

* cited by examiner

MULTIPLE MOLD STRUCTURE METHODS OF MANUFACTURING VERTICAL MEMORY DEVICES

CROSS-REFERENCE TO RELATED APPLICATION

This application claims priority under 35 USC §119 to Korean Patent Application No. 10-2011-0091289 filed on Sep. 8, 2011, in the Korean Intellectual Property Office (KIPO), the entire contents of which is incorporated herein by reference.

BACKGROUND

Example embodiments described herein relate to methods of manufacturing vertical memory devices. More particularly, example embodiments described herein relate to methods of manufacturing vertical memory devices having a vertical channel.

Recently, vertical memory devices have been developed in order to have a high integration degree. The vertical memory devices may have a mold structure including stacked gate structures and a vertical channel in a cell region of a substrate and a gate structure in a single layer in a peripheral region of the substrate, thereby having different heights in the cell region and the peripheral region. Thus, in a manufacture of a vertical memory device, a planarization process for an insulating interlayer may not be easily performed due to the height difference between the cell region and the peripheral region of the substrate.

SUMMARY

Example embodiments described herein may provide methods of manufacturing vertical memory devices having good planarization characteristics.

According to example embodiments described herein, there is provided methods of manufacturing vertical memory devices. In these methods, a first insulating interlayer is formed on a substrate including a first region and a second region. The first insulating interlayer has a top surface, a height of which is greater in the first region than in a second region. A first planarization stop layer and a second insulating interlayer are sequentially formed on the first insulating interlayer. The second insulating interlayer is planarized until a portion of the first planarization stop layer is exposed. Portions of the first planarization stop layer and the first and second insulating interlayers in the second region are removed to expose a surface of the substrate. A lower mold structure including first insulation layer patterns, first sacrificial layer patterns and a second planarization stop layer pattern is formed. The first insulation layer patterns and the first sacrificial layer patterns are alternately and repeatedly formed on the exposed surface of the substrate, and the second planarization stop layer pattern is formed on an outermost first insulation layer pattern. A third insulating interlayer pattern is formed in a space between the lower mold structure and the first insulating interlayer on the substrate. An upper mold structure is formed on the lower mold structure.

In example embodiments described herein, the second planarization stop layer pattern may be formed to have a height the same as that of the exposed portion of the first planarization stop layer.

In example embodiments described herein, when the third insulating interlayer pattern is formed, a third insulating interlayer may be formed on the lower mold structure, the exposed surface of the substrate, the first insulating interlayer and the first planarization stop layer. The third insulating interlayer may be planarized until the first planarization stop layer and the second planarization stop layer pattern are exposed.

In example embodiments described herein, the exposed first planarization stop layer and the exposed second planarization stop layer pattern may be removed after the upper portion of the third insulating interlayer is planarized.

In example embodiments described herein, the first region may be a peripheral circuit region in which peripheral circuits are formed, and the second region may be a cell region in which memory cells are formed.

In example embodiments described herein, a gate structure may be further formed on the substrate in the first region, prior to forming the first insulating interlayer.

In example embodiments described herein, when the lower mold structure is formed, a first insulation layer and a first sacrificial layer may be alternately and repeatedly formed. A second planarization stop layer may be formed on an outermost first insulation layer. The second planarization stop layer, the first insulation layers and the first sacrificial layers may be patterned to form a second planarization stop pattern, a plurality of first insulation layer patterns and a plurality of first sacrificial layer patterns, respectively.

In example embodiments described herein, the lower mold structure may have a stepped shape in which a width decreases from adjacent the substrate to remote from the substrate.

In example embodiments described herein, when the upper mold structure is formed, the second planarization stop layer pattern may be removed to expose an outermost first insulation layer pattern. A second sacrificial layer and a second insulation layer may be alternately and repeatedly formed on the exposed outermost first insulation layer pattern. A third planarization stop layer may be formed on an outermost second insulation layer. The third planarization stop layer, the second insulation layers and the second sacrificial layers may be patterned to form a third planarization stop layer pattern, a plurality of second insulation layer patterns and a plurality of second sacrificial layer patterns, respectively.

In example embodiments described herein, the upper mold structure may be formed to have a stepped shape in which a width decreases from adjacent the lower mold structure to remote from the lower mold structure and wherein a second sacrificial layer pattern of the upper mold structure that is adjacent to lower mold structure has a width narrower than that of the first insulation layer pattern of the lower mold structure that is adjacent the upper mold structure.

In example embodiments described herein, a channel may be formed through the first and second insulation layer patterns and the first and second sacrificial layer patterns.

In example embodiments described herein, the first and second sacrificial layer patterns may be removed to form a plurality of gaps exposing a sidewall of the channel. A ground selection line, a word line and a string selection line in the gaps, respectively, may be formed.

In example embodiments described herein, a dummy line filling at least one of the gaps may be further formed.

In example embodiments described herein, a tunnel insulation layer pattern, a charge trapping layer pattern and a blocking layer pattern sequentially stacked between the channel and the ground selection line, the word line and the string selection line may be formed.

In example embodiments described herein, a bit line electrically connected to the channel may be formed.

According to other example embodiments described herein, in a manufacture of a vertical memory device, a first insulating interlayer may be formed on a substrate having a peripheral circuit region in which peripheral circuits are formed and a cell region in which memory cells are formed. The first insulating interlayer may have an outer surface of which a height may be greater at least a portion in the peripheral circuit region than in the cell region due to the peripheral circuits. A planarization stop layer and a second insulating interlayer may be sequentially formed on the first insulating interlayer. The second insulating interlayer may be planarized until the planarization stop layer is exposed so that the first insulating interlayer having a constant height may remain in the peripheral circuit region regardless of the position thereof. After exposing a top surface of the substrate in the cell region, a lower mold structure may be formed to have a height substantially the same as that of the planarization stop layer. Thus, in a planarization process for forming a third insulating interlayer filling a space between the lower mold structure and the first insulating interlayer, residue due to a height difference may not be generated.

According to other example embodiments described herein, in a manufacture of a vertical memory device, a first insulating layer may be formed on a peripheral circuit region of a substrate that includes peripheral circuits therein, the first insulating layer on the peripheral circuit region of the substrate exposing the substrate in a cell region thereof. A lower mold structure for a plurality of vertical memory cells may be formed on the substrate in the cell region that was exposed, the lower mold structure having an outer surface that extends a same distance from the substrate as an outer surface of the first insulating layer. An upper mold structure for the plurality of vertical memory cells is formed on the lower mold structure. A second insulating layer is formed on the first insulating layer in the peripheral circuit region, the second insulating layer having an outer surface that extends a same distance from the substrate as an outer surface of the upper mold structure. Finally, a plurality of vertical memory cells may be formed in the upper and lower mold structures.

In example embodiments described herein, the following is performed between the forming a lower mold structure and the forming an upper mold structure: forming a third insulating layer on the substrate between the first insulating layer and the lower mold structure, the third insulating layer extending the same distance from the substrate as the outer surfaces of the lower mold structure and the first insulating layer. In other embodiments described herein, forming a second insulating layer comprises forming a second insulating layer on the first insulating layer in the peripheral circuit region and on the third insulating layer, the second insulating layer having an outer surface on the first and third insulating layers that extends a same distance from the substrate as an outer surface of the upper mold structure.

According to still other embodiments described herein, the forming a first insulating layer comprises forming a first stop layer on the first insulating layer on the peripheral circuit region of the substrate, the forming a lower mold structure comprises forming a second stop layer on the lower mold structure, and outer surfaces of the first and second stop layers extend a same distance from the substrate.

According to still other embodiments described herein, the forming an upper mold structure comprises forming a third stop layer on the upper mold structure, the forming a second insulating layer comprises forming a fourth stop layer on the second insulating layer in the peripheral circuit region, and outer surfaces of the third and fourth stop layers extend a same distance from the substrate.

BRIEF DESCRIPTION OF THE DRAWINGS

Example embodiments described herein will be more clearly understood from the following detailed description taken in conjunction with the accompanying drawings.

FIGS. 1 to 14 are cross-sectional views illustrating methods of manufacturing a vertical memory device in accordance with example embodiments described herein.

FIG. 15 is a block diagram illustrating a data processing system according to various embodiments described herein.

Figure 1:
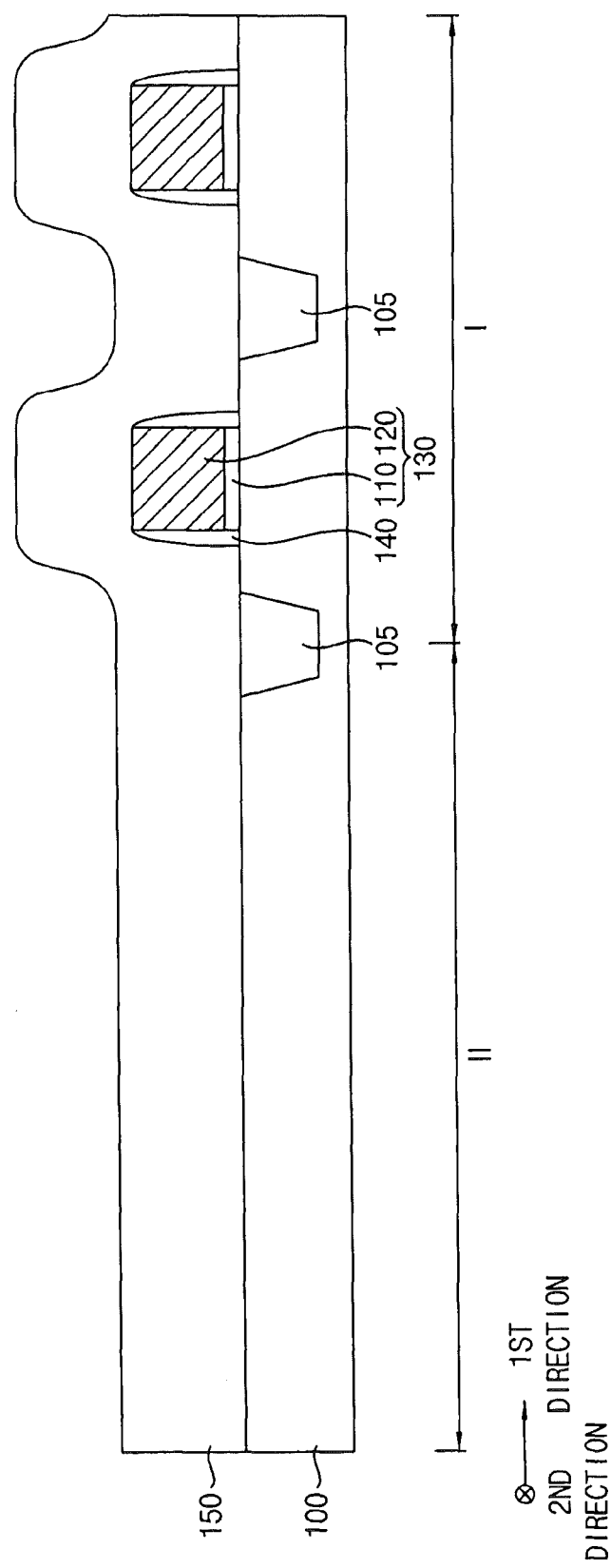
FIGS. 1-15 represent non-limiting, example embodiments described herein.

It should be noted that these figures are intended to illustrate the general characteristics of methods, structure and/or materials utilized in certain example embodiments described herein and to supplement the written description provided below. These drawings are not, however, to scale and may not precisely reflect the precise structural or performance characteristics of any given embodiment, and should not be interpreted as defining or limiting the range of values or properties encompassed by example embodiments described herein. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments described herein will now be described more fully with reference to the accompanying drawings, in which example embodiments described herein are shown. Example embodiments described herein may, however, be embodied in many different forms and should not be construed as limited to the example embodiments described herein; rather, these example embodiments described herein are provided so that this description will be thorough and complete, and will fully convey the concept of example embodiments described herein to those of ordinary skill in the art. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments described herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments described herein only and is not intended to be limiting of the example embodiments described herein. As used herein, the singular forms "a," "an" and "the" are intended to include the plural forms as well, unless the context clearly indicates otherwise. It will be further understood that the terms "comprises," "comprising," "includes," "including," "have" and/or "having" when used in this specification, specify the presence of stated features, integers, steps, operations, elements, and/or components, but do not preclude the presence or addition of one or more other features, integers, steps, operations, elements, components, and/or groups thereof.

Example embodiments described herein are described herein with reference to cross-sectional illustrations that are schematic illustrations of idealized example embodiments described herein (and intermediate structures). As such, variations from the shapes of the illustrations as a result, for example, of manufacturing techniques and/or tolerances, are to be expected. Thus, example embodiments described herein should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. For example, when two regions or surfaces are described or illustrated as being a same distance from a substrate, they are subject to variations resulting, for example, from manufacturing techniques and/or tolerances.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 14 are cross-sectional views illustrating methods of manufacturing a vertical memory device in accordance with example embodiments described herein.

Referring to FIG. 1, an isolation layer 105 may be formed on a substrate that may be divided into a first region I and a second region II.

The substrate 100 may include a semiconductor material, e.g., silicon, germanium, etc. In example embodiments described herein, the first and second regions I and II may be a peripheral circuit region in which peripheral circuits are formed and a cell region in which memory cells are formed, respectively.

The isolation layer 105 may be formed both in the first and second regions I and II, and the substrate 100 may be divided into an active region and a field region by the isolation layer 105.

Peripheral circuits may be formed on the substrate 100 in the first region I. For example, a gate structure 130 as a circuit element may be formed in the first region I. In example embodiments described herein, the gate structure 130 may include a gate insulation layer 110 and a gate electrode 120 sequentially stacked on the substrate 100, and a gate spacer 140 may be formed on a sidewall of the gate structure 130. Impurity regions (not shown) may be further formed at upper portions of the active region of the substrate 100 adjacent to the gate structure 130 to form, for example, source and drain regions. In example embodiments described herein, a plurality of gate structures 130 may be formed not only on the active region but also on the field region.

A first insulating interlayer 150 covering the gate structure 130 and the gate spacer 140 may be formed on the substrate 100 both in the first and second regions I and II. The gate structure 130 has been formed in the first region I, and thus the first insulating interlayer 150 may be formed to have a top surface a height of which may be greater in the second region II than in the first region I. In example embodiments described herein, the first insulating interlayer 150 may be formed to include silicon oxide.

Figure 2:
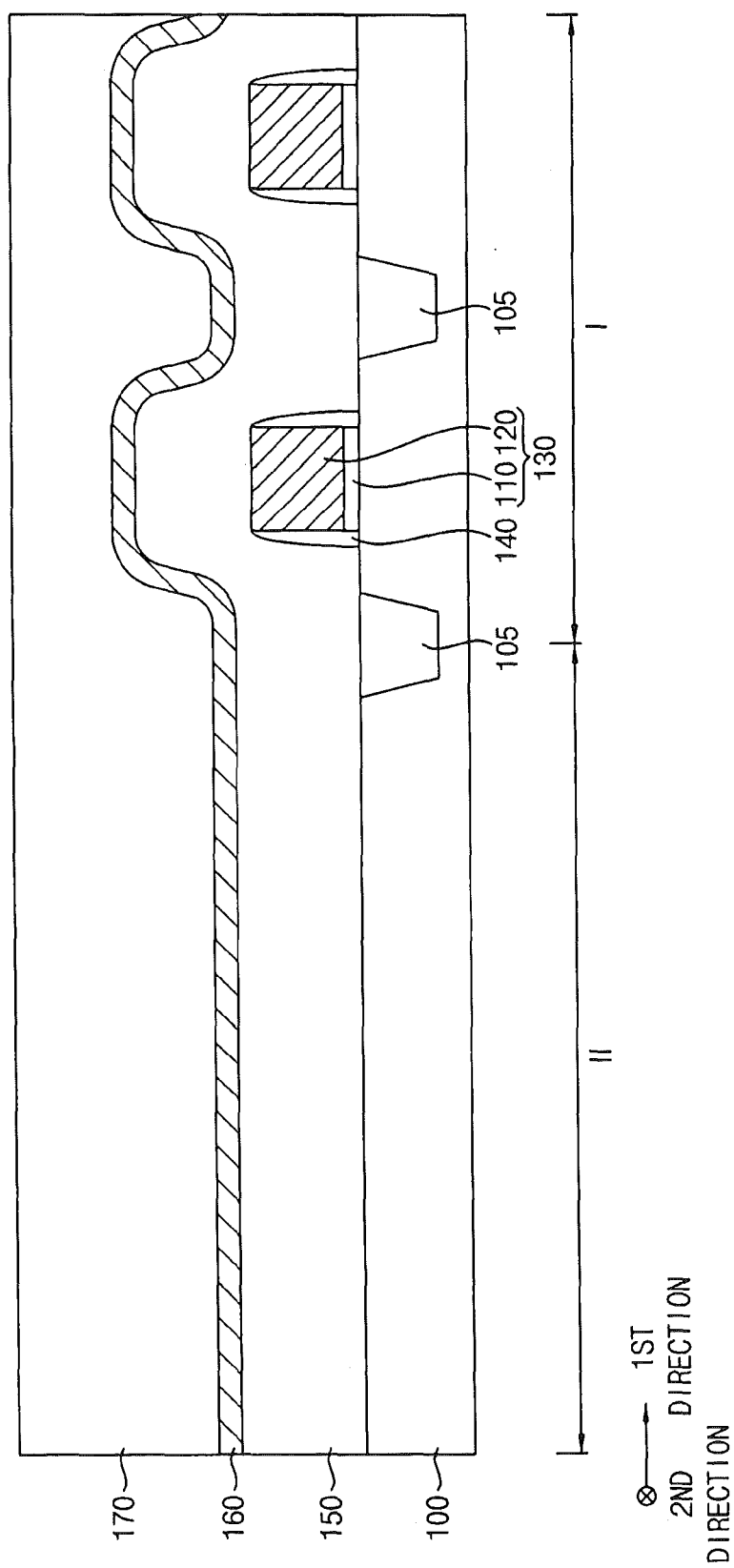

Referring to FIG. 2, a first planarization stop layer 160 and a second insulating interlayer 170 may be sequentially formed in the first insulating interlayer 150.

In example embodiments described herein, the first planarization stop layer 160 may be formed to include silicon nitride, and the second insulating interlayer 170 may be formed to include silicon oxide.

Figure 3:
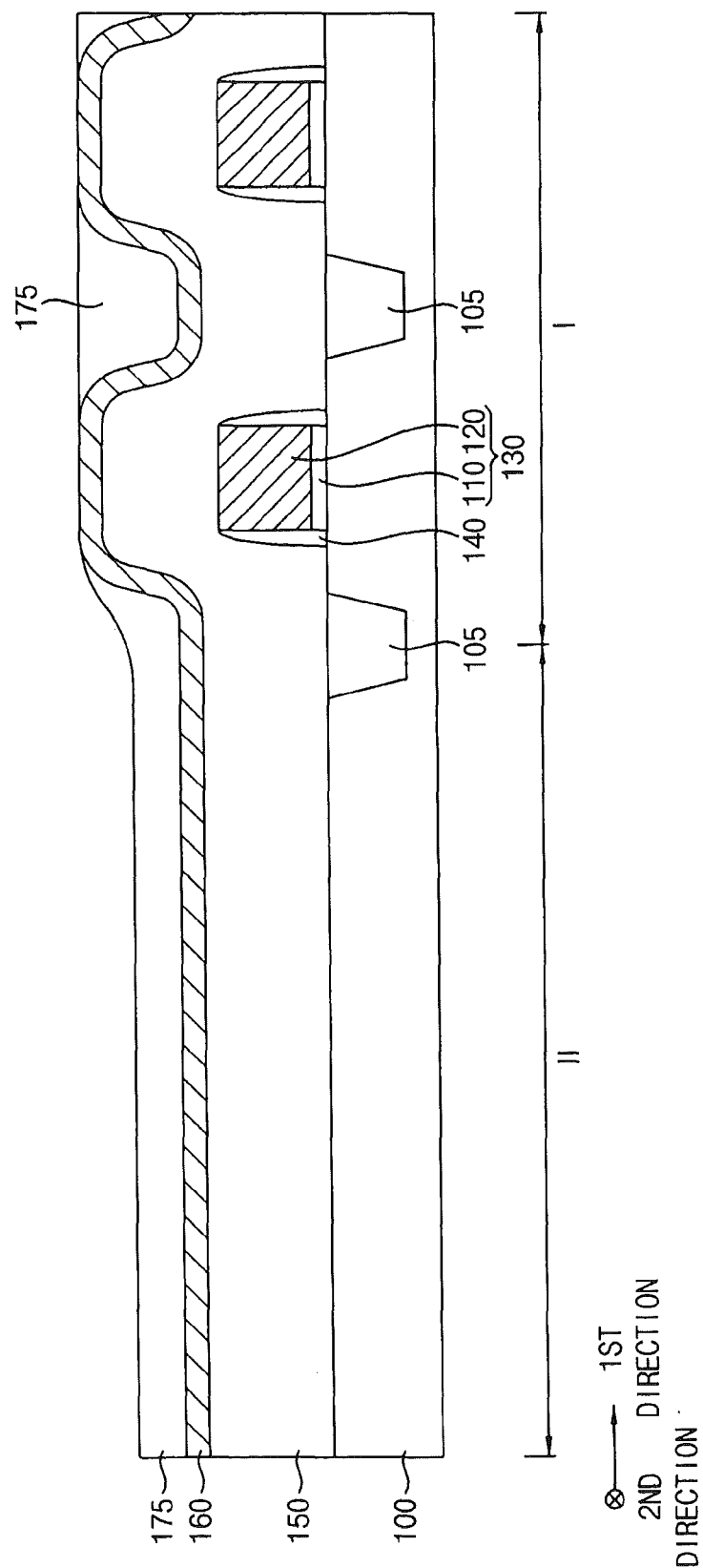

Referring to FIG. 3, a planarization process may be performed on an upper portion of the second insulating layer 170 until a top or outermost surface of the first planarization stop layer 160 may be exposed.

In example embodiments described herein, the planarization process may include a chemical mechanical polishing (CMP) process. Thus, an upper or outer portion of the second insulating interlayer 170 may be removed so that a second insulating interlayer 175 may remain. A portion of the second insulating interlayer 175 remaining in the second region II may have a concave top surface due to the dishing phenomenon during the planarization process.

Figure 4:
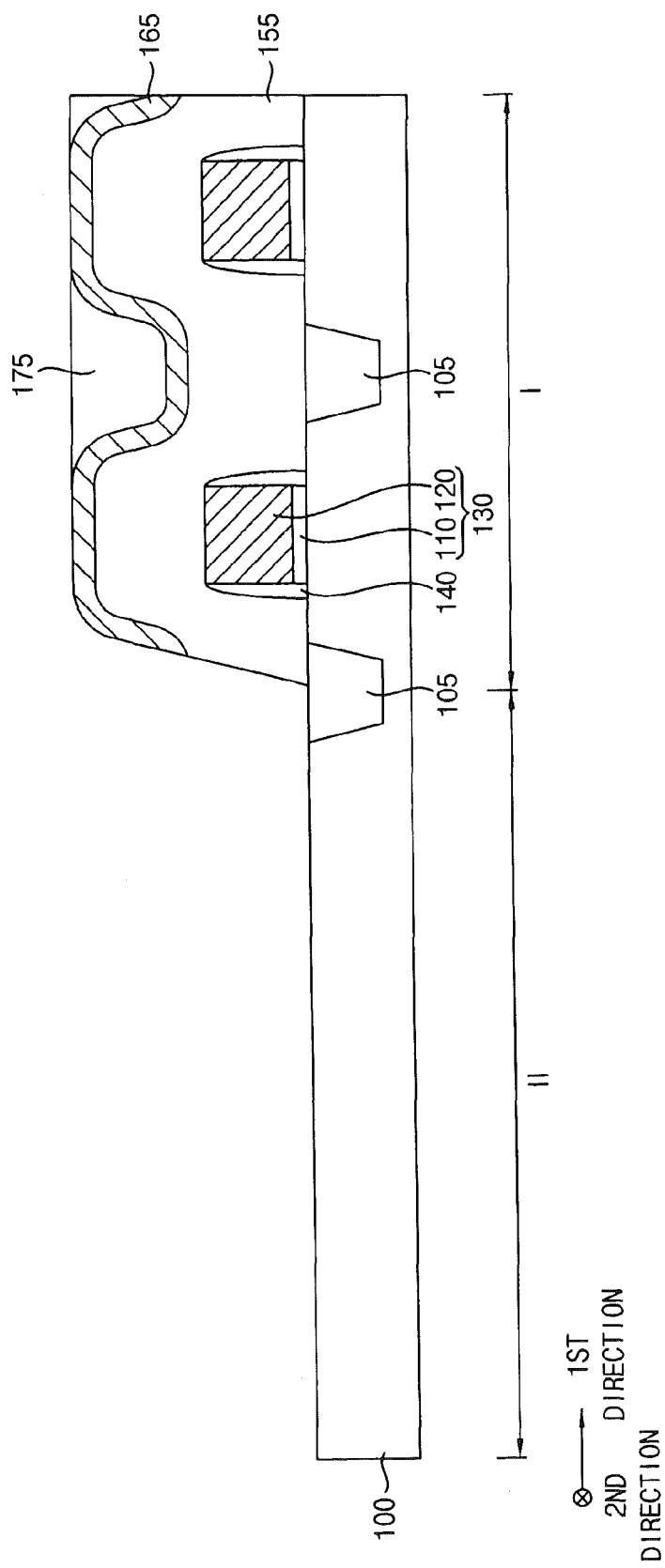

Referring to FIG. 4, a first photoresist pattern (not shown) may be formed on portions of the first planarization stop layer 160 and the second insulating interlayer in the first region I, and portions of the first planarization stop layer 160 and the second insulating interlayer in the second region II may be etched using the first photoresist pattern as an etching mask.

Thus, a first insulating interlayer pattern 155, a first planarization stop layer pattern 165 and a second insulating interlayer pattern 175 may remain in the first region I, and a top surface of the substrate 100 may be exposed in the second region II. The portion of the second insulating interlayer pattern 175 in the second region II may be removed so that the concave top surface thereof due to the dishing phenomenon may not have an influence on subsequent processes. Thus, FIG. 4 illustrates forming a first insulating layer on a peripheral circuit region of a substrate that includes peripheral circuits therein, the first insulating layer on the peripheral circuit region of the substrate exposing the substrate in a cell region thereof, according to example embodiments described herein.

The first photoresist pattern may be removed.

Figure 5:
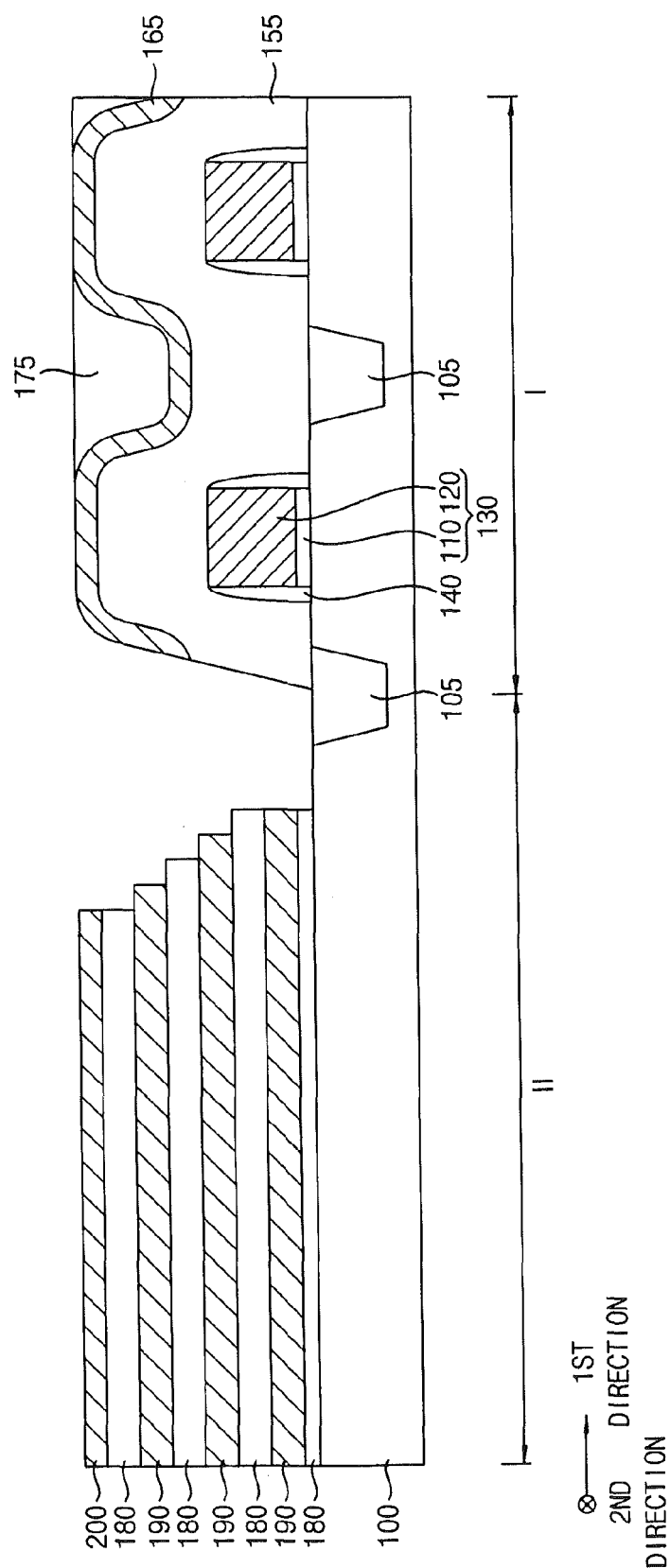

Referring to FIG. 5, a first insulation layer and a first sacrificial layer may be alternately and repeatedly formed on the substrate 100 having the first insulating interlayer pattern 155, the first planarization stop layer pattern 165 and the second insulating interlayer pattern 175 thereon, and a second planarization stop layer may be formed on an uppermost (outermost) first insulation layer. The second planarization stop layer, the first insulation layers and the first sacrificial layers may be patterned using a second photoresist pattern (not shown) covering the first region I and a portion of the second region II as an etching mask to form a second planarization stop layer pattern 200, a plurality of first insulation layer patterns 180 and a plurality of first sacrificial layer patterns 190. Thus, a lower mold structure including the first insulation layer patterns 180, the first sacrificial layer patterns 190 and the second planarization stop layer pattern 200 may be formed on the substrate 100 in the second region II. The first insulation layer patterns 180 and the first sacrificial layer patterns 190 may have decreased widths from a lower level to an upper level, and thus the lower mold structure may have a stepped shape.

In example embodiments described herein, the second planarization stop layer pattern 200 may have a top surface coplanar with a top surface of the first planarization stop layer pattern 165.

In example embodiments described herein, the first insulation layer, the first sacrificial layer and the second planarization stop layer may be formed by a chemical vapor deposition (CVD) process, a plasma enhanced chemical vapor deposition (PECVD) process, and/or an atomic layer deposition (ALD) process, etc. The first insulation layer that may be formed directly on a top surface of the substrate 100 may be formed by a thermal oxidation process. In example embodiments described herein, the first insulation layer may be formed to include a silicon oxide, e.g., silicon dioxide, silicon oxycarbide, and/or fluorinated silicon oxide, etc. The first sacrificial layer may be formed to include a material having an etch selectivity with respect to that of the first insulation layer, e.g., silicon nitride, and/or silicon boronitride, etc. The second planarization stop layer may be formed to include a material substantially the same as that of the first planarization stop layer pattern 165, e.g., silicon nitride.

Figure 6:
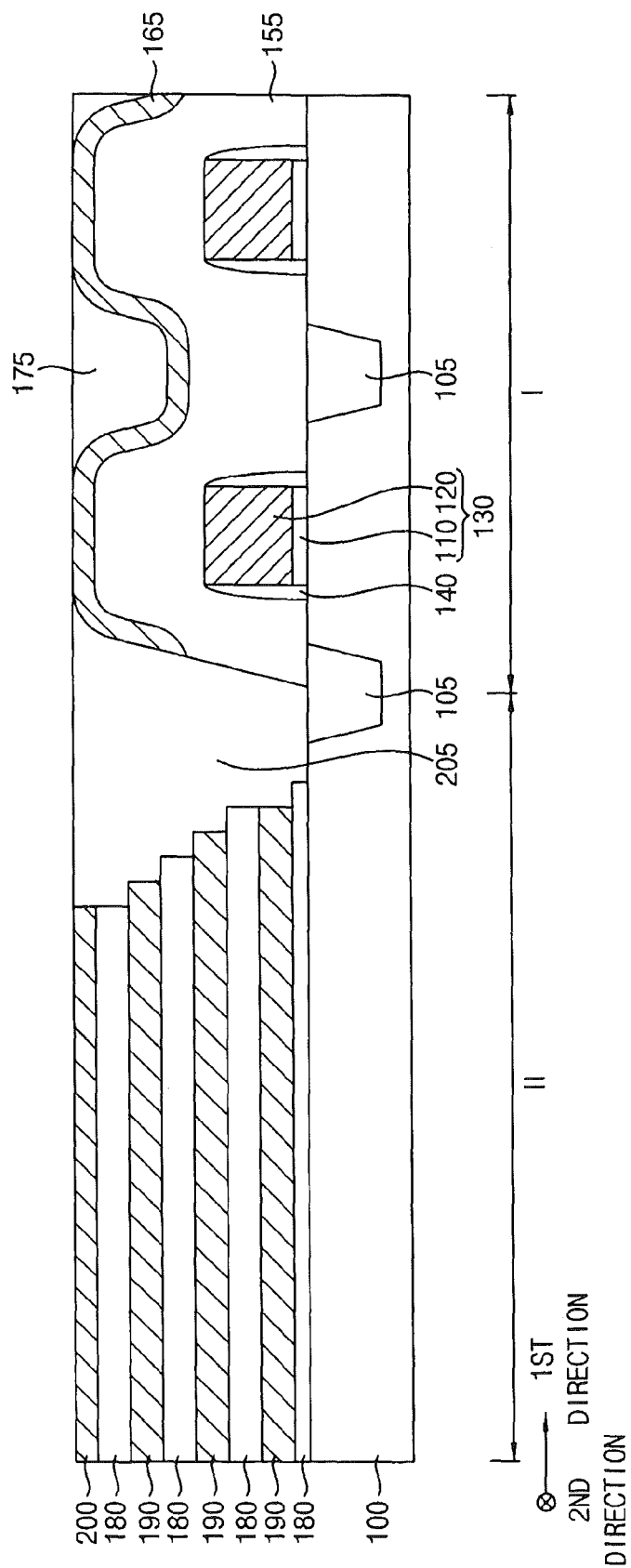

Referring to FIG. 6, a third insulating interlayer may be formed on the substrate 100 having the lower mold structure thereon, and may be planarized until the top surfaces of the first and second planarization stop layer patterns 165 and 200 are exposed to form a third insulating interlayer pattern 205.

The top surfaces of the first and second planarization stop layer patterns 165 and 200 may have substantially the same height as each other, and thus residue may not be generated at an interface between the first and second regions I and II when the planarization process is performed.

Figure 7:
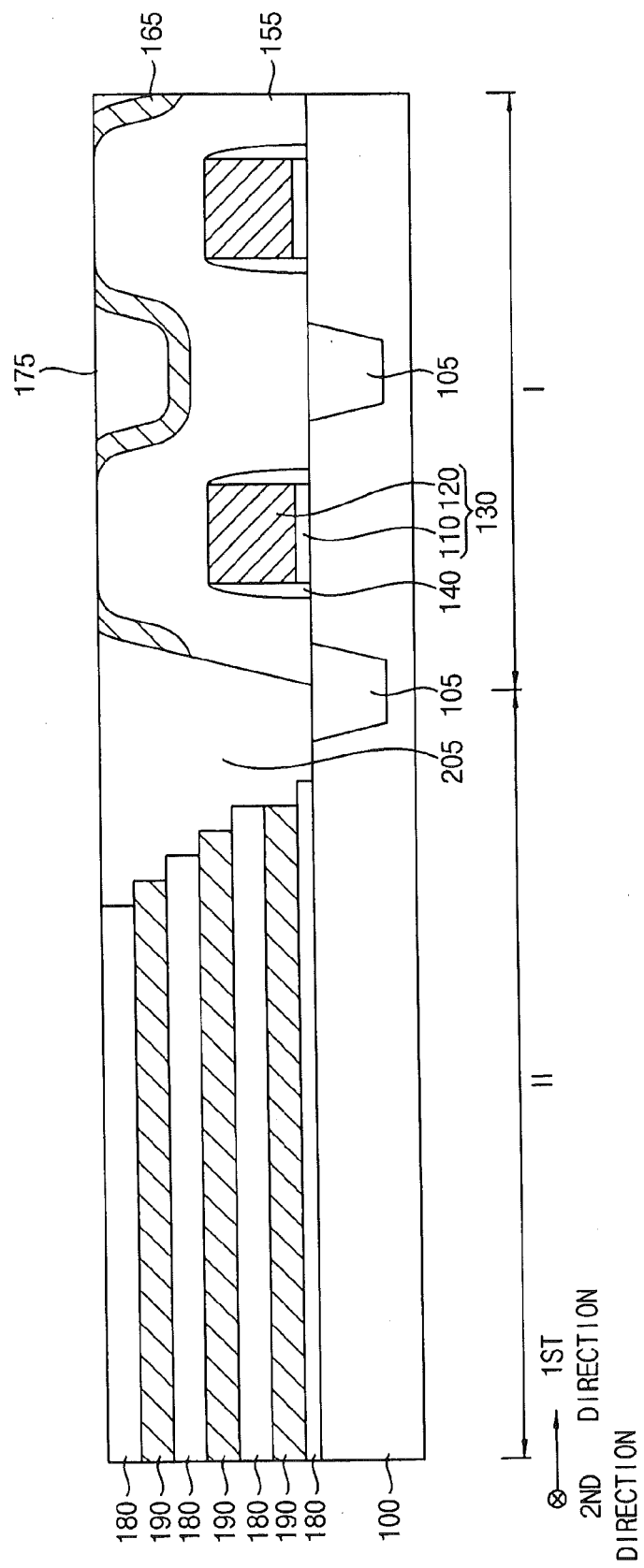

Referring to FIG. 7, the first and second planarization stop layer patterns 165 and 200 may be removed. Upper portions of the second and third insulating interlayer patterns 175 and 205 may be also removed, and a portion of the first planarization stop layer pattern 165 may remain in the first region I according to the width thereof.

Thus, the lower mold structure on the substrate 100 in the second region II may have the first insulation layer patterns 180 and the first sacrificial layer patterns 190 alternately stacked, and a top surface of the first insulating interlayer pattern 155 may be exposed in the first region I. Thus, FIG. 7 illustrates forming a lower mold structure for a plurality of vertical memory cells on the substrate in the cell region that was exposed, the lower mold structure having an outer surface that extends a same distance from the substrate as an outer surface of the first insulating layer, according to example embodiments detailed herein. FIG. 7 also illustrates forming a third insulating layer on the substrate between the first insulating layer and the lower mold structure, the third insulating layer extending the same distance from the substrate as the outer surfaces of the lower mold structure and the first insulating layer, according to example embodiments detailed herein.

Figure 8:
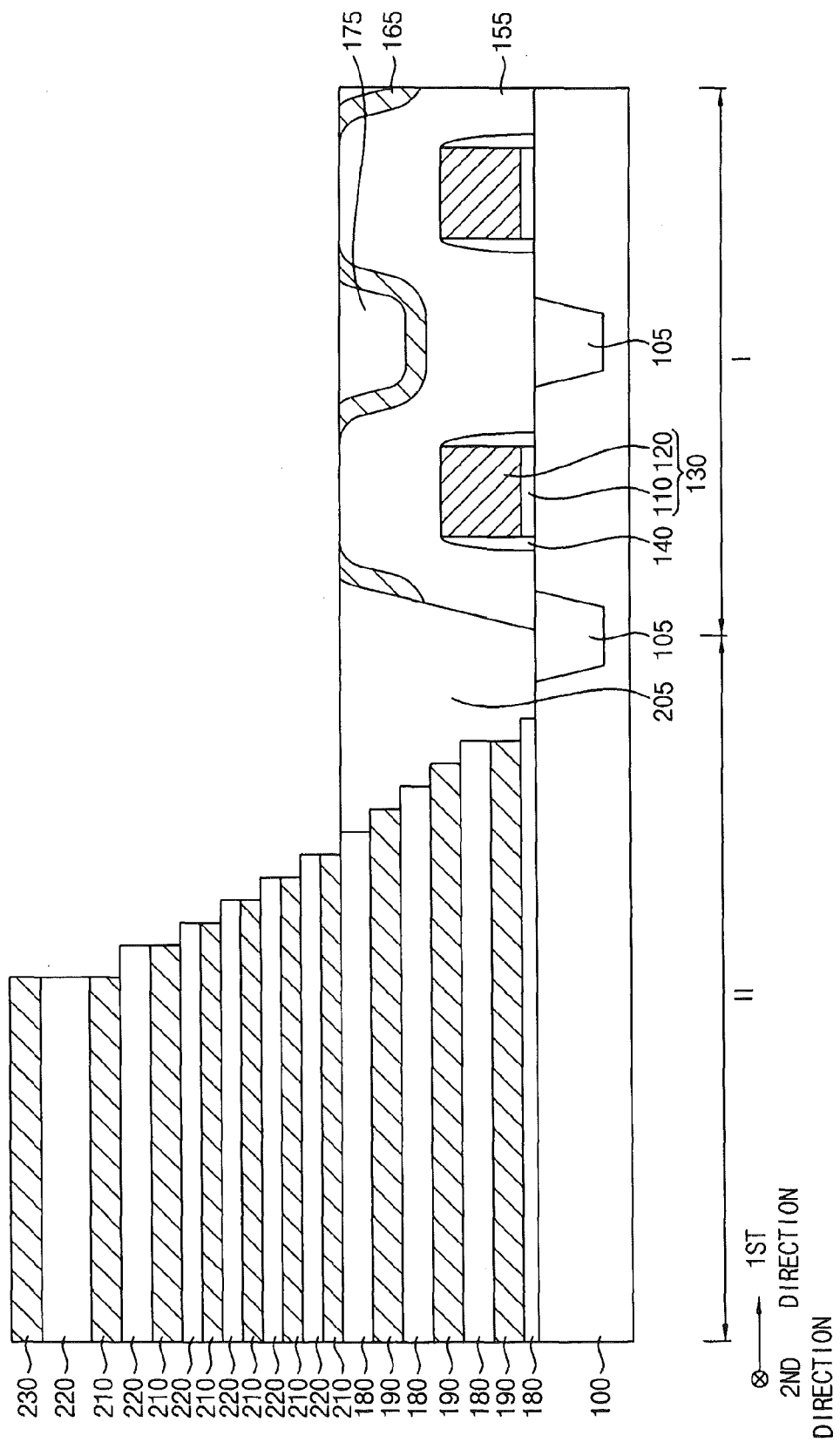

Referring to FIG. 8, a second sacrificial layer and a second insulation layer may be alternately and repeatedly formed on the lower mold structure, the third insulation layer pattern 205 and the exposed first insulation layer pattern 155, and a third planarization stop layer may be formed on an uppermost second insulation layer.

The third planarization stop layer, the second insulation layers and the second sacrificial layers may be patterned using a third photoresist pattern (not shown) covering the first region I and a portion of the second region II as an etching mask to form a third planarization stop layer pattern 230, a plurality of second insulation layer patterns 220 and a plurality of second sacrificial layer patterns 210, respectively. Thus, an upper mold structure including the second sacrificial layer patterns 210, the second insulation layer patterns 220 and the third planarization stop layer pattern 230 may be formed on the lower mold structure. The second sacrificial layer patterns 210 and the second insulation layer patterns 220 may have decreased widths from a lower level to an upper level, and thus the upper mold structure may have a stepped shape. A lowermost second sacrificial layer pattern 210 may have a width narrower than that of an uppermost first insulation layer pattern 180. Thus FIG. 8 illustrates forming an upper mold structure for a plurality of vertical memory cells on the lower mold structure, according to example embodiments described herein.

In example embodiments described herein, the second sacrificial layer, the second insulation layer, and the third planarization stop layer may be formed by a CVD process, a PECVD process and/or an ALD process, etc. In example embodiments described herein, the second sacrificial layer, the second insulation layer, and the third planarization stop layer may be formed to include materials substantially the same as those of the first sacrificial layer, the first insulation layer, and the second planarization stop layer, respectively. Alternatively, the third planarization stop layer may be formed to include a different material from that of the second planarization stop layer, e.g., polysilicon.

Figure 9:
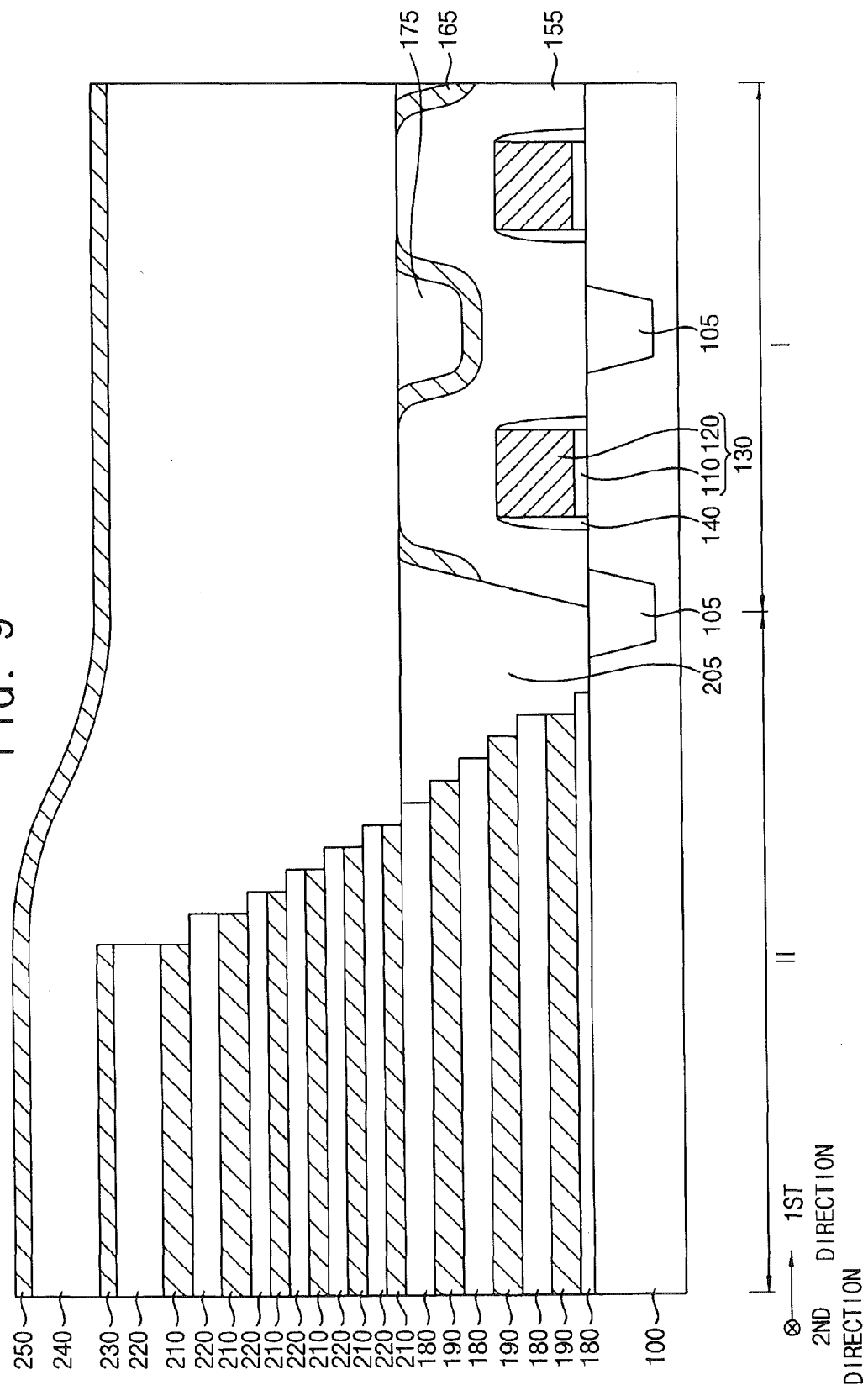

Referring to FIG. 9, a fourth insulating interlayer 240 covering the upper mold structure may be formed on the first, second and third insulating interlayer patterns 155, 175 and 205, and a fourth planarization stop layer 250 may be formed on the fourth insulating interlayer 240.

Thus, the fourth insulating interlayer 240 may be formed to have a top surface, a height of which may be greater in the second region II than in the first region I. In example embodiments described herein, the fourth insulating interlayer 240 may be formed to have a height the same as that of the uppermost second insulation layer pattern 220 in the first region I, and the fourth planarization stop layer 250 may be formed to have a height the same as that of the third planarization stop layer pattern 230 in the first region I. In example embodiments described herein, the fourth planarization stop layer 250 may be formed to include a material the same as that of the first and second planarization stop layer patterns 165 and 220, e.g., silicon nitride.

Figure 10:
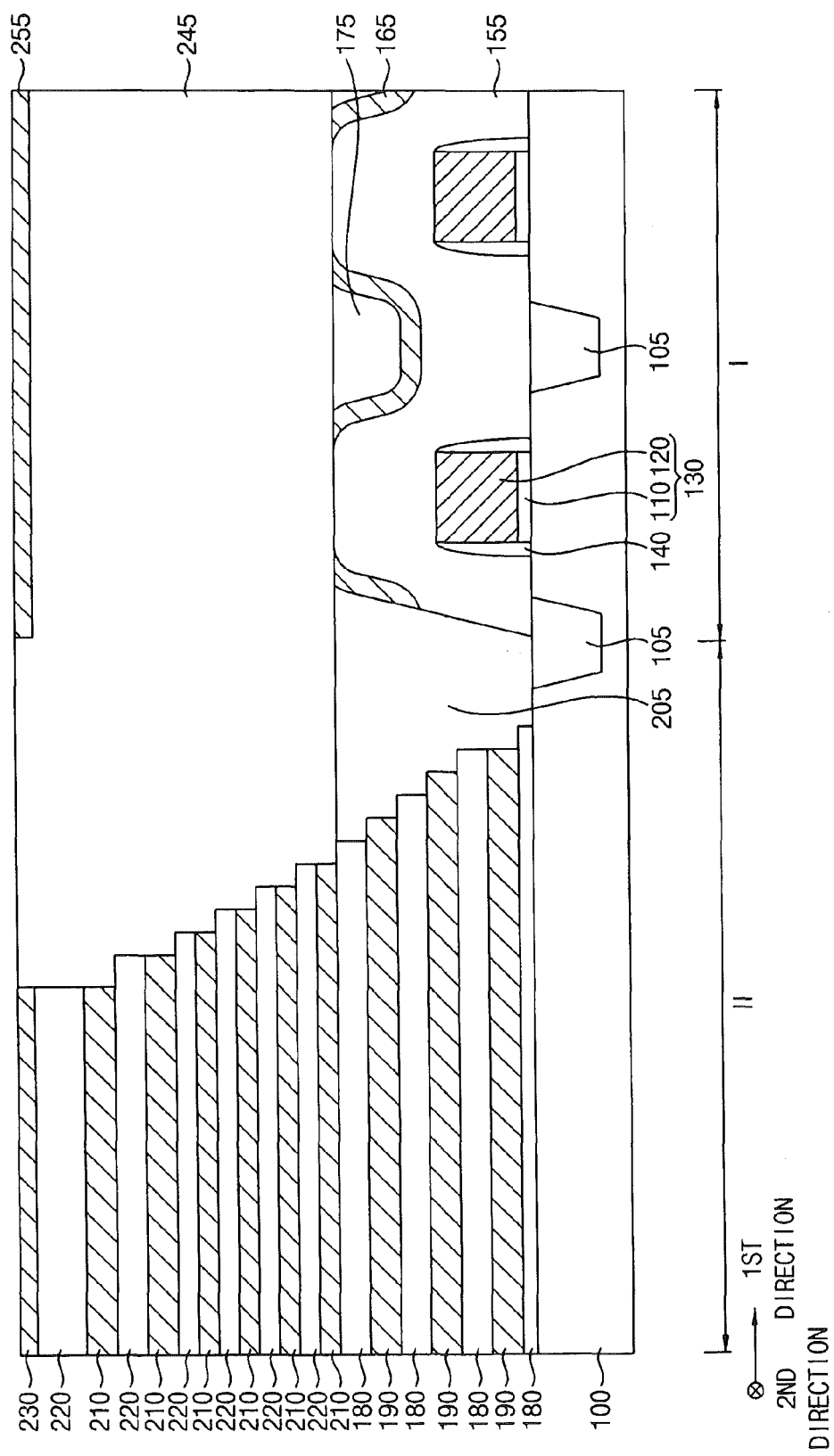

Referring to FIG. 10, portions of the fourth planarization stop layer 250 and the fourth insulating interlayer 240 in the second region II may be removed to expose the third planarization stop layer pattern 230. Thus, the fourth planarization stop layer 250 and the fourth insulating interlayer 240 may be transformed into a fourth planarization stop layer pattern 255 and a fourth insulating interlayer pattern 245, respectively.

In example embodiments described herein, upper portions of the fourth planarization stop layer 250 and the fourth insulating interlayer 240 may be removed using a fourth photoresist pattern (not shown) covering the first region I and a portion of the second region II as an etching mask, and portions of the fourth planarization stop layer 250 and the fourth insulating interlayer 240 remaining in the second region II may be removed by a planarization process to form the fourth planarization stop layer pattern 255 and the fourth insulating interlayer pattern 245. Thus, the fourth planarization stop layer pattern 255 may be formed only in the first region I.

Figure 11:
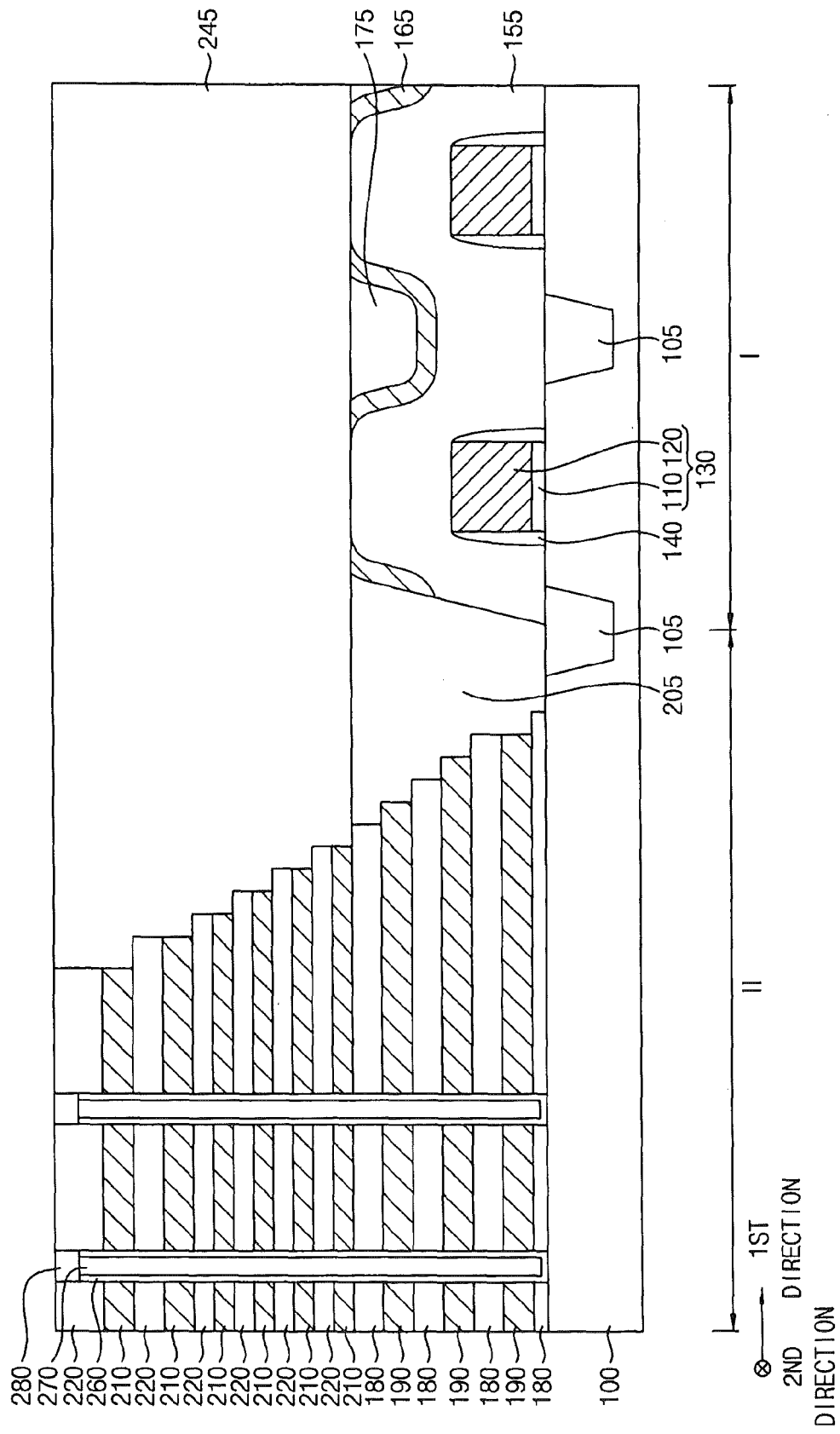

Referring to FIG. 11, the third and fourth planarization stop layer patterns 230 and 255 may be removed so that the upper mold structure may include the second insulation layer patterns 220 and the second sacrificial layer patterns 210. The fourth insulating interlayer pattern 245 may be partially removed. Thus FIG. 11 illustrates forming a second insulating layer on the first insulating layer in the peripheral circuit region, the second insulating layer having an outer surface that extends a same distance from the substrate as an outer surface of the upper mold structure, according to example embodiments described herein.

A first opening (not shown) may be formed through the first and second insulation layer patterns 180 and 220 and the first and second sacrificial layer patterns 190 and 210 to expose a top surface of the substrate 100, and a channel 260, a filling layer pattern 270 and a pad 280 may be formed to fill the first opening.

Particularly, after forming a hard mask (not shown) on an uppermost second insulation layer pattern 220, a dry etching process may be performed using the hard mask as an etching mask to form the first opening. In example embodiments described herein, a plurality of first openings may be formed in a first direction substantially parallel to the top surface of the substrate 100 to define a first opening column, and a plurality of first opening columns may be formed in a second direction substantially perpendicular to the second direction to define a first opening array.

A channel layer may be formed on a sidewall the first opening, the exposed top surface of the substrate 100, the uppermost second insulation layer pattern 220 and the fourth insulating interlayer pattern 245. In example embodiments described herein, the channel layer may be formed to include polysilicon and/or amorphous silicon. In an example embodiment, a heat treatment process may be performed on the channel layer so that an amorphous silicon may be transformed into polysilicon or the crystalline size of polysilicon may be increased.

A filling layer may be formed on the channel layer to sufficiently fill a remaining portion of the first opening, and the filling layer and the channel layer may be planarized until a top surface of the uppermost second insulation layer pattern 220 may be exposed to form a filling layer pattern 270 and a channel 260 filling the first opening. The channel 260 may be formed to have a hollow cylindrical shape and/or a cup shape on the bottom and the sidewall of the first opening, and the filling layer pattern 270 may be formed to have a pillar shape filling a central space enclosed by the cylindrical channel 260.

In example embodiments described herein, a channel column and/or a channel array, which may correspond to the first opening column and/or the first opening array, may be formed. The planarization process may be performed by, for example, a CMP process and/or an etch back process.

Alternatively, the channel 260 may be formed to have a pillar shape instead of the hollow cylindrical shape or the cup shape, and in this case, the filling layer pattern 270 may not be formed.

Upper portions of the filling layer pattern 270 and the channel 260 may be removed to form a recess (not shown), and a pad 280 filling the recess may be formed. In example embodiments described herein, the pad 280 may be formed to include amorphous silicon, polysilicon and/or doped polysilicon.

Figure 12:
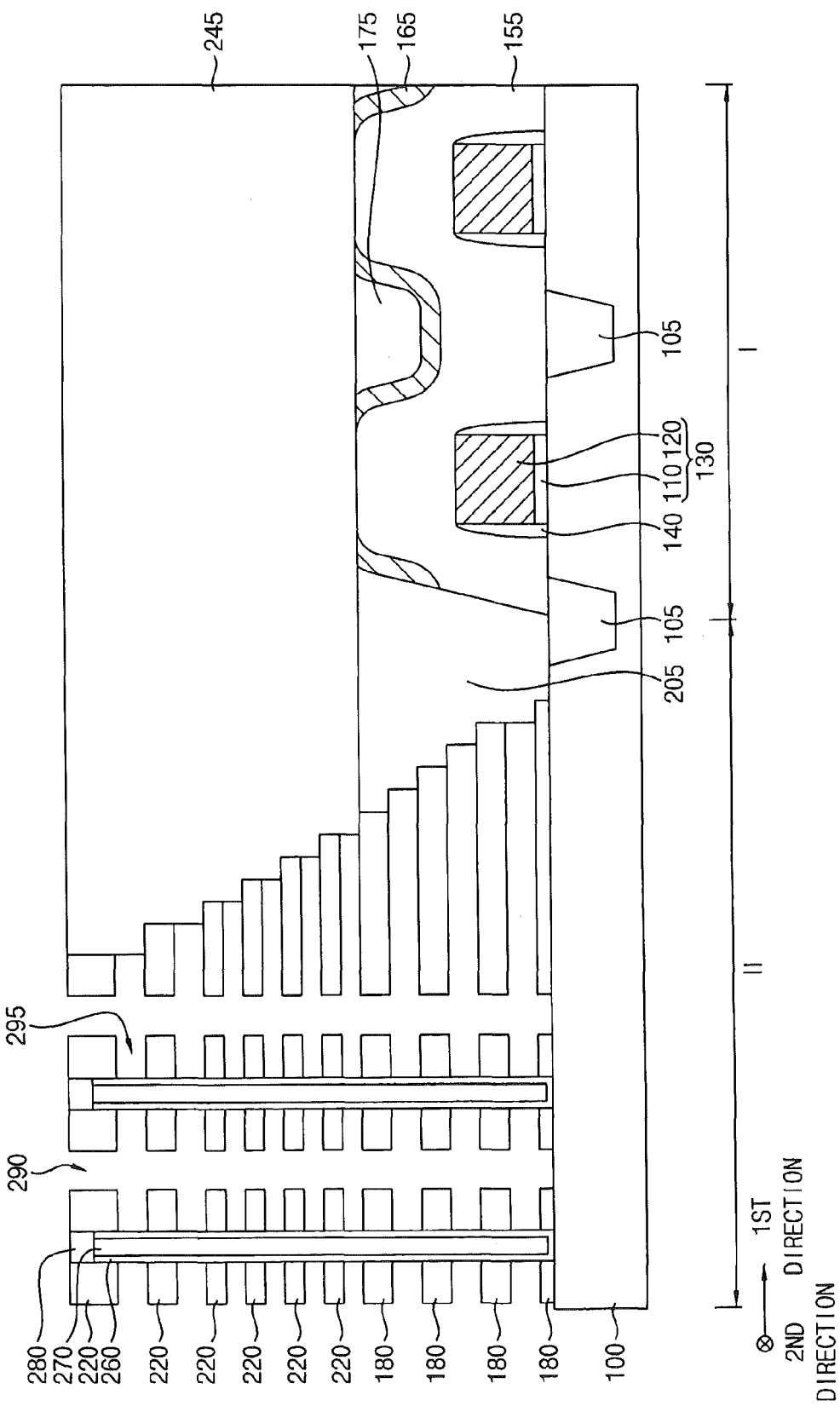

Referring to FIG. 12, a second opening 290 may be formed through the first and second insulation layer patterns 180 and 220 and the first and second sacrificial layer patterns 190 and 210 to expose a top surface of the substrate 100.

In example embodiments described herein, after forming a hard mask (not shown) on the uppermost second insulation layer pattern 220, a dry etching process may be performed using the hard mask as an etching mask to form the second opening 290.

In example embodiments described herein, a plurality of second openings 290 may be formed in the first direction, and each second opening 290 may extend in the second direction. Thus, each of the first and second insulation layer patterns 180 and 220 and the first and second sacrificial layer patterns 190 and 210 may be divided into a plural number along the first direction.

The first and second sacrificial layer patterns 190 and 210 may be removed to form a gap 295 between the insulation layer patterns 180 and 220 at adjacent levels. In example embodiments described herein, the sacrificial layer patterns 190 and 210 exposed by the second opening 290 may be removed by, for example, a wet etch process using an etch solution including phosphoric acid and/or sulfuric acid. As the gap 295 is formed, an outer sidewall of the channel 260 may be partially exposed.

Figure 13:
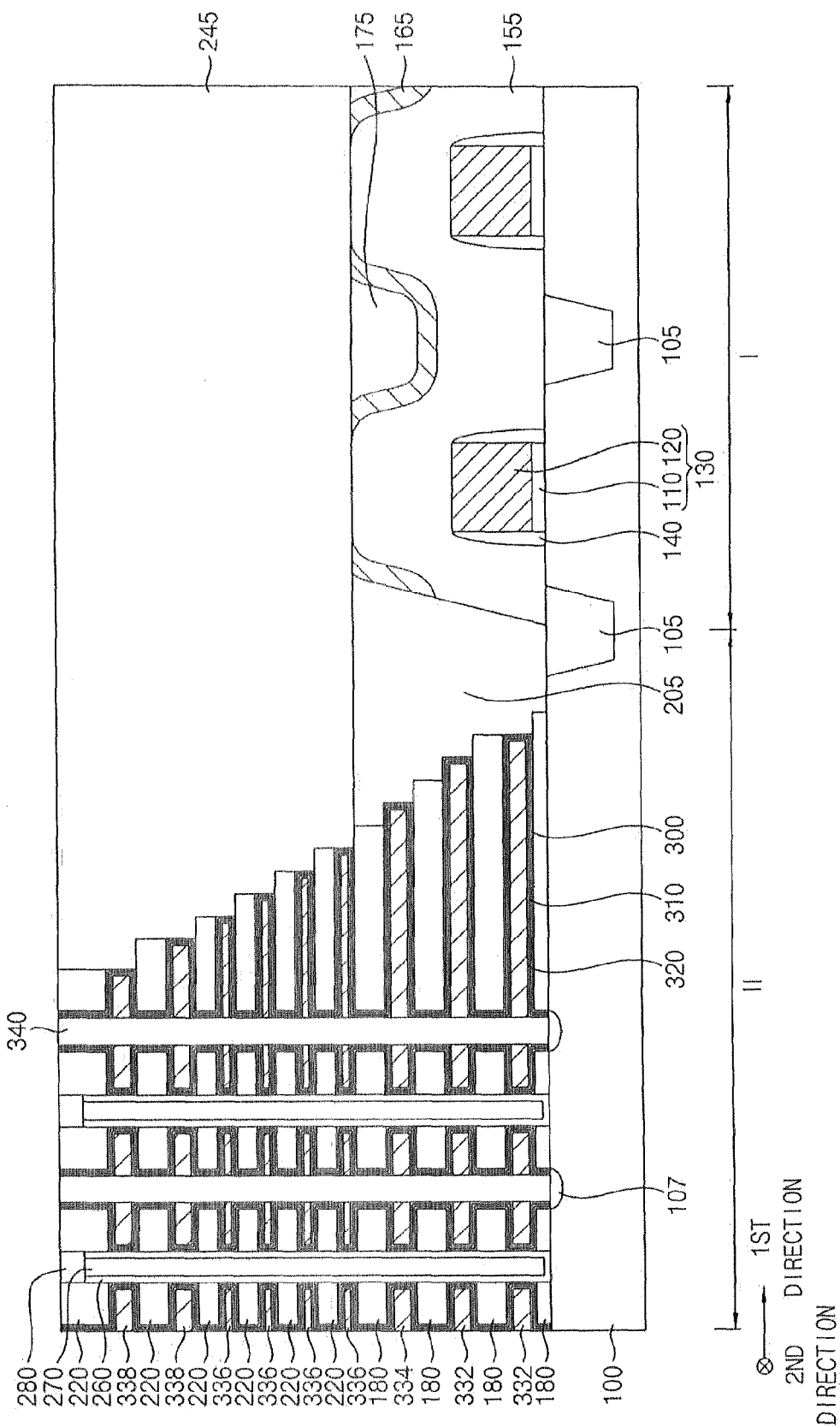

Referring to FIG. 13, a tunnel insulation layer pattern 300, a charge trapping layer pattern 310 and a blocking layer pattern 320 may be sequentially formed on the exposed outer sidewall of the channel 260, an inner wall of the gap 295, a surface of the insulation layer patterns 180 and 220, and a ground selection line (GSL) 332, a dummy line 334, a word line 336 and a string selection line (SSL) 338 filling a remaining portion of the gap 295 may be formed. Additionally, a third insulation layer pattern 340 may be formed to fill the second opening 290.

Particularly, a tunnel insulation layer, a charge trapping layer and a blocking layer may be sequentially formed on the exposed outer sidewall of the channel 260, the inner wall of the gap 295, the surface of the insulation layer patterns 180 and 220, a top surface of the substrate 100, a top surface of the pad 280 and a top surface of the fourth insulating interlayer pattern 245.

In example embodiments described herein, the tunnel insulation layer may be, for example, formed to include a silicon oxide by a CVD process. According to at least one example embodiment, the tunnel insulation layer may be formed by a thermal oxidation on the exposed outer sidewall of the channel 260 in the gap 295. In this case, the tunnel insulation layer may not be formed on the surface of the insulation layer patterns 180 and 220.

The charge trapping layer may be formed to include a nitride, for example, a silicon nitride and/or a metal oxide. The blocking layer may be formed to include, for example, a silicon oxide and/or a metal oxide. For example, the metal oxide may include aluminum oxide, hafnium oxide, lanthanum oxide, lanthanum aluminum oxide, lanthanum hafnium oxide, hafnium aluminum oxide, titanium oxide, tantalum oxide and/or zirconium oxide. According to at least one example embodiment, the blocking layer may be formed to be a multi-layered structure including a silicon oxide layer and a metal oxide layer.

A gate electrode layer may be formed on the blocking layer to fill the gap 295.

In example embodiments described herein, the gate electrode layer may be formed to include a metal and/or a metal nitride. For example, the gate electrode layer may be formed to include a metal and/or a metal nitride with a low electrical resistance, for example, tungsten, tungsten nitride, titanium, titanium nitride, tantalum, tantalum nitride and/or platinum. According to at least one example embodiment, the gate electrode layer may be formed to be a multi-layered structure of a barrier layer including a metal nitride and a metal layer including a metal.

The gate electrode layer may be formed by, for example, a CVD process and/or an ALD process, and the second opening 290 may be partially filled.

The gate electrode layer may be partially removed to form the GSL 332, the dummy line 334, the word line 336 and the SSL 338 in the gaps 295. In example embodiments described herein, the gate electrode layer may be partially removed by, for example, a wet etch process.

Each of the GSL 332, the dummy line 334, the word line 336 and the SSL 338 may be formed at a single level or at a plurality of levels. According to at least one example embodiment, each of the GSL 332 and the SSL 338 may be formed at 2 levels, and the word line 336 may be formed at 4 levels. However, the number of GSLs 332, word lines 336 and SSLs 338 is not limited. The dummy line 334 may not be formed.

When the gate electrode layer is partially removed, portions of the blocking layer, the charge trapping layer and the tunnel insulation layer on top surfaces of the uppermost second insulation layer pattern 220, the pad 280 and the substrate 100 may also be removed to form the blocking layer pattern 320, the charge trapping layer pattern 310 and the tunnel insulation layer pattern 300, respectively. According to at least one example embodiment, portions of the blocking layer, the charge trapping layer and the tunnel insulation layer on a sidewall of the insulation layer patterns 180 and 220 may be also removed so that the blocking layer pattern 320, the charge trapping layer pattern 310 and the tunnel insulation layer pattern 300 may be formed only on the inner wall of the gap 295.

In a process in which the gate electrode layer, the blocking layer, the charge trapping layer and the tunnel insulation layer are partially removed, a third opening (not shown) exposing a top surface of the substrate 100 and extending in the second direction may be formed, and impurities may be implanted into the exposed top surface of the substrate 100 to form an impurity region 107. In example embodiments described herein, the impurities may include n-type impurities, for example, phosphorus and/or arsenic. In example embodiments described herein, the impurity region 107 may extend in the second direction and serve as a common source line (CSL).

A metal silicide pattern (not shown), e.g., a cobalt silicide pattern may be further formed on the impurity region 107.

A third insulation layer pattern 340 filling the third opening may be formed. In example embodiments described herein, after a third insulation layer filling the third opening may be formed on the substrate 100, the pad 280 and the fourth insulating interlayer pattern 245, the third insulation layer may be planarized until a top surface of the fourth insulating interlayer pattern 245 is exposed to form the third insulation layer pattern 340.

Figure 14:
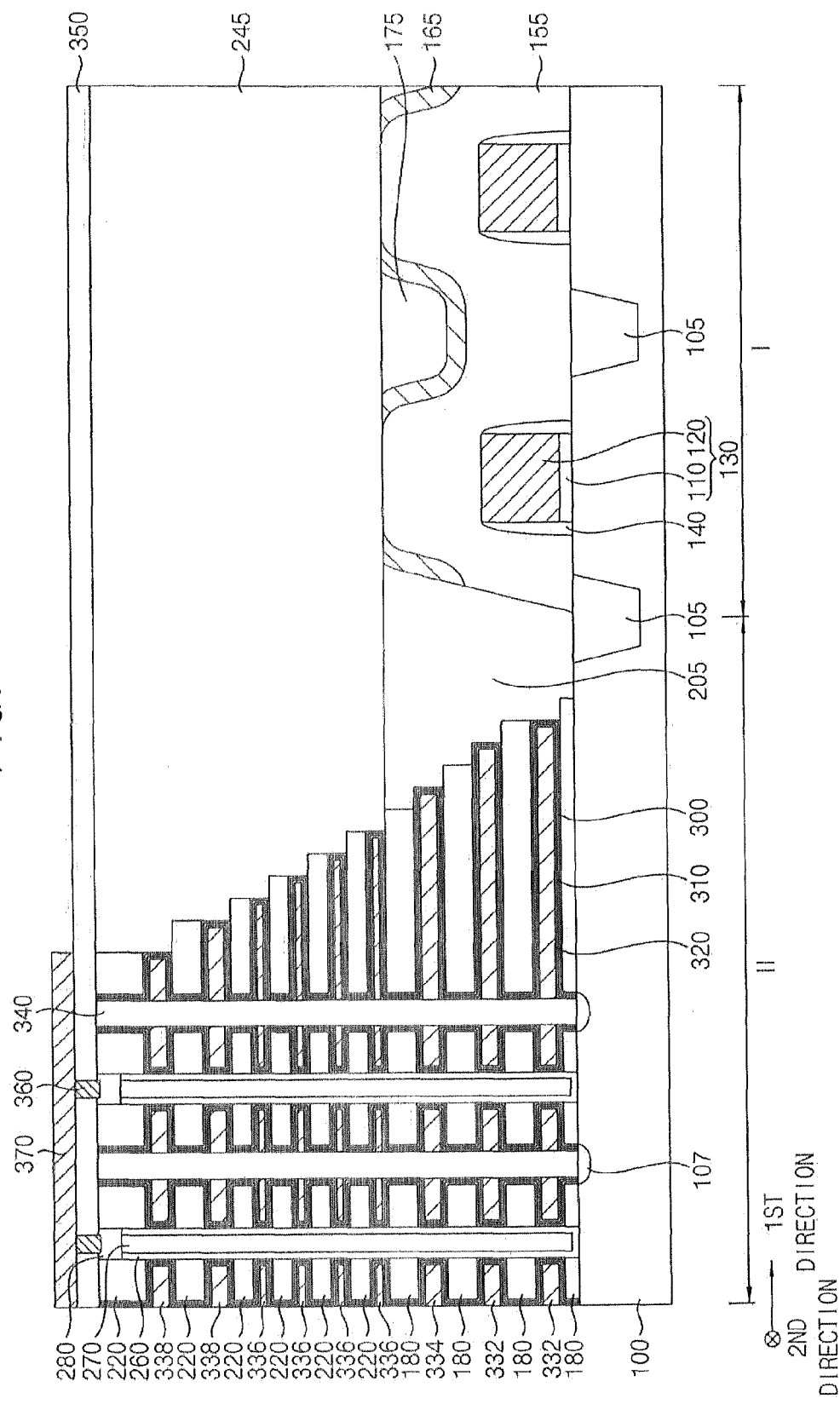

Referring to FIG. 14, a fifth insulating interlayer 350 may be formed on the uppermost second insulation layer pattern 220, the pad 280, the blocking layer pattern 320, the charge trapping layer pattern 310 and the tunnel insulation layer pattern 300 and the fourth insulating interlayer pattern 245, and a fourth opening (not shown) may be formed to expose a top surface of the pad 280. In example embodiments described herein, a plurality of fourth openings corresponding to the channels 260 and the pads 280 may be formed in the first direction to form a fourth opening column, and a plurality of fourth opening columns may be formed in the second direction to form a fourth opening array.

A bit line contact 360 may be formed on the pad 280 to fill the fourth opening. The bit line contact 360 may be formed to include, for example, a metal, a metal nitride and/or doped polysilicon.

A bit line 370 electrically connected to the bit line contact 360 may be formed to complete the vertical memory device. The bit line 370 may be formed to include, for example, a metal, a metal nitride and/or doped polysilicon. In example embodiments described herein, a plurality of bit lines 370 may be formed in the second direction, and each of the bit lines 370 may be formed to extend in the first direction. Thus FIG. 14 illustrates forming a plurality of vertical memory cells in the upper and lower mold structures, according to example embodiments disclosed herein.

Figure 15:
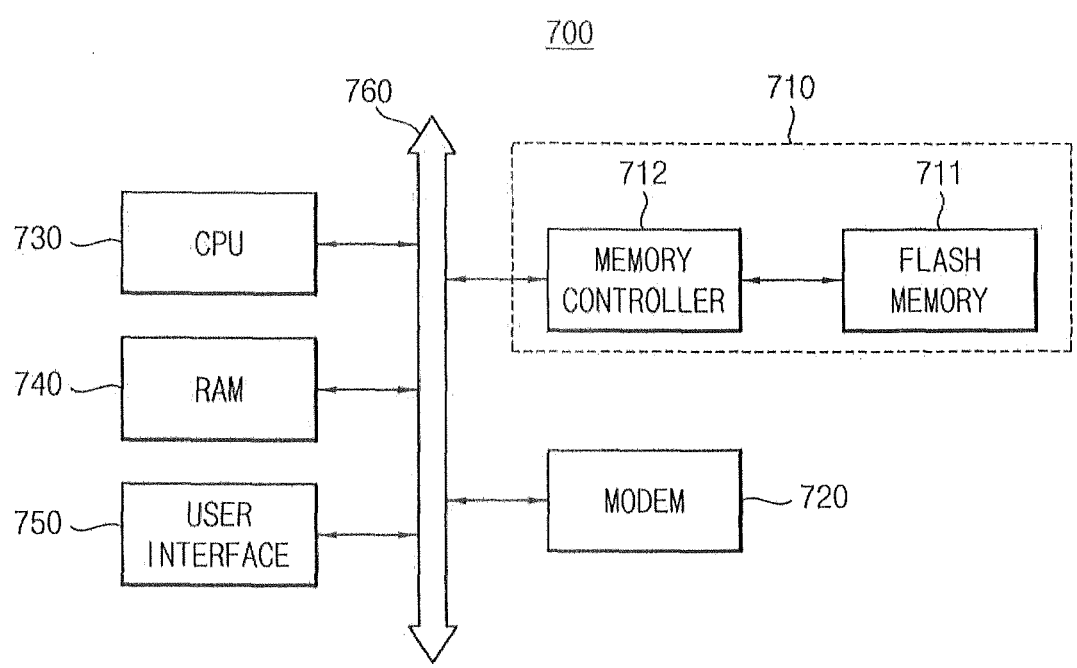

FIG. 15 a block diagram illustrating a data processing system according to various embodiments described herein.

Referring to FIG. 15, a data processing system 700 may include a flash memory system 710 including a vertical memory device manufactured according to any one of the various embodiments described herein. The flash memory system 710 may include a flash memory 711 and a memory controller 712.

The data processing system 700 may include a mobile appliance, a computer, or the like. For example, the data processing system 700 may include a modem 720, a central processing unit (CPU) 730, a random access memory (RAM) 740, and/or a user interface 750 electrically connected to the flash memory system 710, respectively through a system bus 760. Data processed by the CPU 730 or externally input may be stored in the flash memory system 710.

The data processing system 700 may be provided as a memory card, a solid state disk (SSD), a camera image sensor, and/or other application chipsets. For example, the flash memory system 710 may be constituted by a SSD and in this case, the data processing system 700 can stably and reliably store data of large capacity in the flash memory system 710.

While example embodiments described herein have been particularly shown and described, it will be understood by one of ordinary skill in the art that variations in form and detail may be made therein without departing from the spirit and scope of the claims.

What is claimed is:

1. A method of manufacturing a vertical memory device, comprising:

forming a first insulating interlayer on a substrate including a first region and a second region, the first insulating interlayer having a top surface, a height of which is greater at least a portion in the first region than in a second region;

sequentially forming a first planarization stop layer and a second insulating interlayer on the first insulating interlayer;

planarizing the second insulating interlayer until a portion of the first planarization stop layer is exposed;

removing portions of the first planarization stop layer and the first and second insulating interlayers in the second region to expose a surface of the substrate;

forming a lower mold structure including first insulation layer patterns, first sacrificial layer patterns and a second planarization stop layer pattern, the first insulation layer patterns and the first sacrificial layer patterns being alternately and repeatedly formed on the exposed surface of the substrate, the second planarization stop layer pattern being formed on an outermost first insulation layer pattern;

forming a third insulating interlayer pattern in a space between the lower mold structure and the first insulating interlayer on the substrate; and forming an upper mold structure on the lower mold structure.

2. The method of claim 1, wherein the second planarization stop layer pattern is formed to have a height substantially the same as that of the exposed portion of the first planarization stop layer.

3. The method of claim 1, wherein forming the third insulating interlayer pattern includes:

forming a third insulating interlayer on the lower mold structure, the exposed surface of the substrate, the first insulating interlayer and the first planarization stop layer; and planarizing the third insulating interlayer until the first planarization stop layer and the second planarization stop layer pattern are exposed.

4. The method of claim 3, further comprising removing the exposed first planarization stop layer and the exposed second planarization stop layer pattern, after planarizing the upper portion of the third insulating interlayer.

5. The method of claim 1, wherein the first region is a peripheral circuit region in which peripheral circuits are formed, and the second region is a cell region in which memory cells are formed.

6. The method of claim 5, further comprising forming a gate structure on the substrate in the first region, prior to forming the first insulating interlayer.

7. The method of claim 1, wherein forming the lower mold structure includes:

alternately and repeatedly forming a first insulation layer and a first sacrificial layer;

forming a second planarization stop layer on an outermost first insulation layer; and patterning the second planarization stop layer, the first insulation layers and the first sacrificial layers to form the second planarization stop pattern, the first insulation layer patterns and a plurality of first sacrificial layer patterns, respectively.

8. The method of claim 7, wherein the lower mold structure has a stepped shape in which a width decreases from adjacent the substrate to remote from the substrate.

9. The method of claim 7, wherein forming the upper mold structure includes:

removing the second planarization stop layer pattern to expose an outermost first insulation layer pattern;

alternately and repeatedly forming a second sacrificial layer and a second insulation layer on the exposed outermost first insulation layer pattern;

forming a third planarization stop layer on an outermost second insulation layer; and patterning the third planarization stop layer, the second insulation layers and the second sacrificial layers to form a third planarization stop layer pattern, a plurality of second insulation layer patterns and a plurality of second sacrificial layer patterns, respectively.

10. The method of claim 9, wherein the upper mold structure has a stepped shape in which a width decreases from adjacent the lower mold structure to remote from the lower mold structure, and wherein a second sacrificial layer pattern of the upper mold structure that is adjacent the lower mold structure has a width narrower than that of the first insulation layer pattern of the lower mold structure that is adjacent the upper mold structure.

11. The method of claim 9, further comprising forming a channel through the first and second insulation layer patterns and the first and second sacrificial layer patterns.

12. The method of claim 11, further comprising:

removing the first and second sacrificial layer patterns to form a plurality of gaps exposing a sidewall of the channel; and forming a ground selection line, a word line and a string selection line in the gaps, respectively.

13. The method of claim 12, further comprising forming a dummy line filling at least one of the gaps.

14. The method of claim 12, further comprising forming a tunnel insulation layer pattern, a charge trapping layer pattern and a blocking layer pattern sequentially stacked between the channel and the ground selection line, the word line and/or the string selection line.

15. The method of claim 11, further comprising forming a bit line electrically connected to the channel.

16. A method of manufacturing a vertical memory device, comprising:

forming a first insulating layer on a peripheral circuit region of a substrate that includes peripheral circuits therein, the first insulating layer on the peripheral circuit region of the substrate exposing the substrate in a cell region thereof;

forming a lower mold structure for a plurality of vertical memory cells on the substrate in the cell region that was exposed, the lower mold structure having an outer surface that extends a same distance from the substrate as an outer surface of the first insulating layer;

forming an upper mold structure for a plurality of vertical memory cells on the lower mold structure;

forming a second insulating layer on the first insulating layer in the peripheral circuit region, the second insulating layer having an outer surface that extends a same distance from the substrate as an outer surface of the upper mold structure; and forming a plurality of vertical memory cells in the upper and lower mold structures.

17. The method of claim 16 wherein the following is performed between the forming a lower mold structure and the forming an upper mold structure:

forming a third insulating layer on the substrate between the first insulating layer and the lower mold structure, the third insulating layer extending the same distance from the substrate as the outer surfaces of the lower mold structure and the first insulating layer.

18. The method of claim 17 wherein forming a second insulating layer comprises forming a second insulating layer on the first insulating layer in the peripheral circuit region and on the third insulating layer, the second insulating layer having an outer surface on the first and third insulating layers that extends a same distance from the substrate as an outer surface of the upper mold structure.

19. The method of claim 16:
wherein the forming a first insulating layer comprises forming a first stop layer on the first insulating layer on the peripheral circuit region of the substrate,
wherein the forming a lower mold structure comprises forming a second stop layer on the lower mold structure, and
wherein outer surfaces of the first and second stop layers extend a same distance from the substrate.

20. The method of claim 19:
wherein the forming an upper mold structure comprises forming a third stop layer on the upper mold structure,
wherein the forming a second insulating layer comprises forming a fourth stop layer on the second insulating layer in the peripheral circuit region, and
wherein outer surfaces of the third and fourth stop layers extend a same distance from the substrate.

\* \* \* \* \*